(12) United States Patent  (10) Patent No.: US 7,994,425 B2
Kubo  (45) Date of Patent: Aug. 9, 2011

(54) FLEXIBLE WIRING CABLE

(75) Inventor: Tomoyuki Kubo, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 713 days.

(21) Appl. No.: 12/051,490

(22) Filed: Mar. 19, 2008

(65) Prior Publication Data

US 2008/0230268 A1 Sep. 25, 2008

(30) Foreign Application Priority Data

Mar. 20, 2007 (JP) ................................ 2007-073228

(51) Int. Cl.
*H02G 3/00* (2006.01)
*H05K 7/20* (2006.01)

(52) U.S. Cl. ...... 174/70 R; 174/254; 174/260; 174/261; 439/67; 439/77; 361/749; 361/776

(58) Field of Classification Search ................ 174/70 R, 174/254, 260, 68.1, 261, 72 A, 251, 255; 347/50, 58; 439/329, 67, 74, 77, 83, 493; 361/749, 784, 776
See application file for complete search history.

(56) References Cited

U.S. PATENT DOCUMENTS 5,414,220 A * 5/1995 Hanato et al. ................. 174/254
6,395,992 B1 * 5/2002 Nakayama et al. ........... 174/254
6,956,288 B2 10/2005 Ueno et al.
7,322,678 B2 * 1/2008 Suzuki ............................ 347/50
2004/0145052 A1 7/2004 Ueno et al.
2005/0174368 A1 8/2005 Suzuki
2005/0253488 A1 11/2005 Ito

FOREIGN PATENT DOCUMENTS

| JP | S56-162697 U | 12/1981 |
| JP | H09-293939 A | 11/1997 |
| JP | 2004-235353 A | 8/2004 |
| JP | 2005-219337 A | 8/2005 |
| JP | 2005-322850 A | 11/2005 |

OTHER PUBLICATIONS

Japan Patent Office, Office Action for Japanese Patent Application No. 2007-073228 (counterpart to above-captioned patent application), mailed Apr. 13, 2011.

* cited by examiner

*Primary Examiner* — Angel R Estrada

(74) *Attorney, Agent, or Firm* — Baker Botts L.L.P.

(57) ABSTRACT

A flexible wiring cable includes a first wiring assembly connected to a load, a second wiring assembly connected to the first wiring assembly and extending toward an external signal source, and a circuit element mounted on the first wiring assembly to drive the load. The second wiring assembly is connected to the first wiring assembly at a position between the mounted circuit element and a connection point with the load. Thus, the heat of the circuit element is also transferred to the second wiring assembly, so that the effect of the heat on the load is reduced.

7 Claims, 8 Drawing Sheets

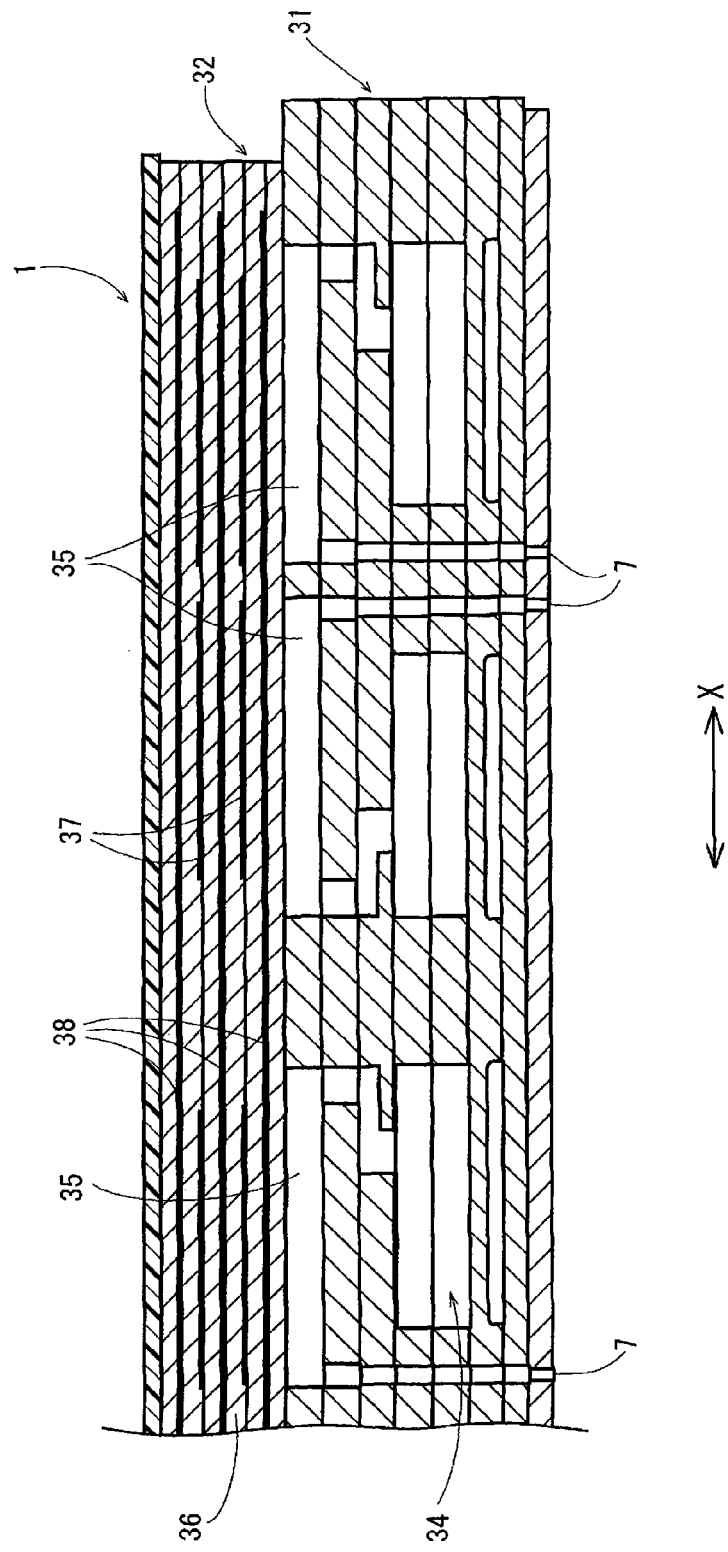

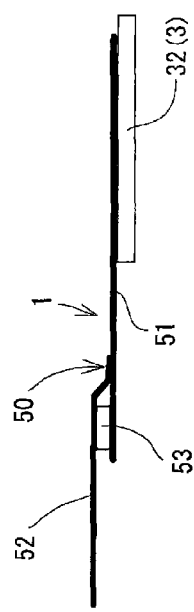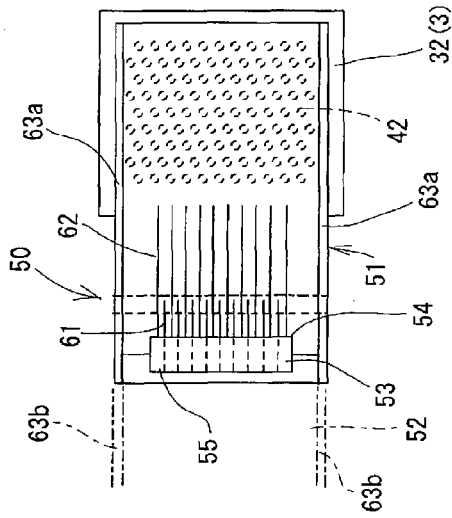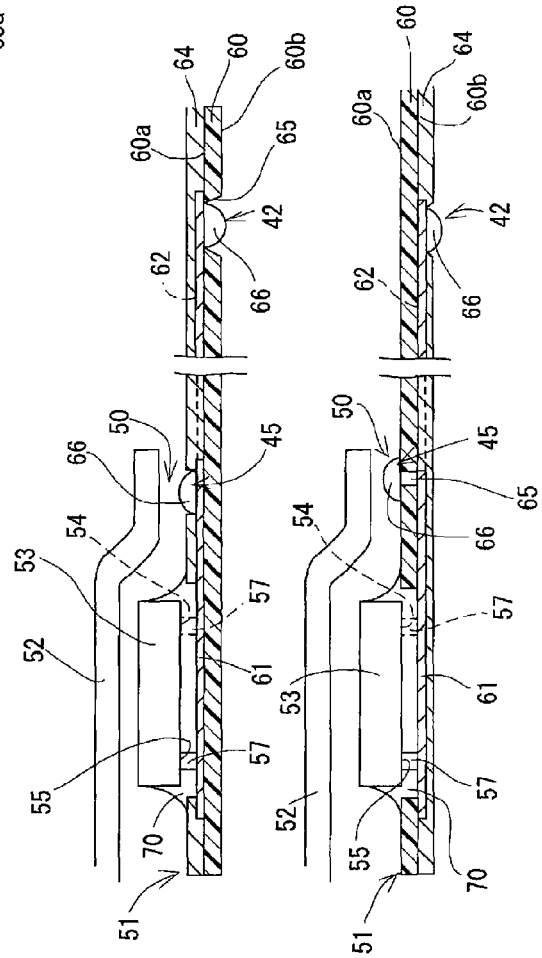
FIG. 6A
FIG. 6B
FIG. 6C
FIG. 6D

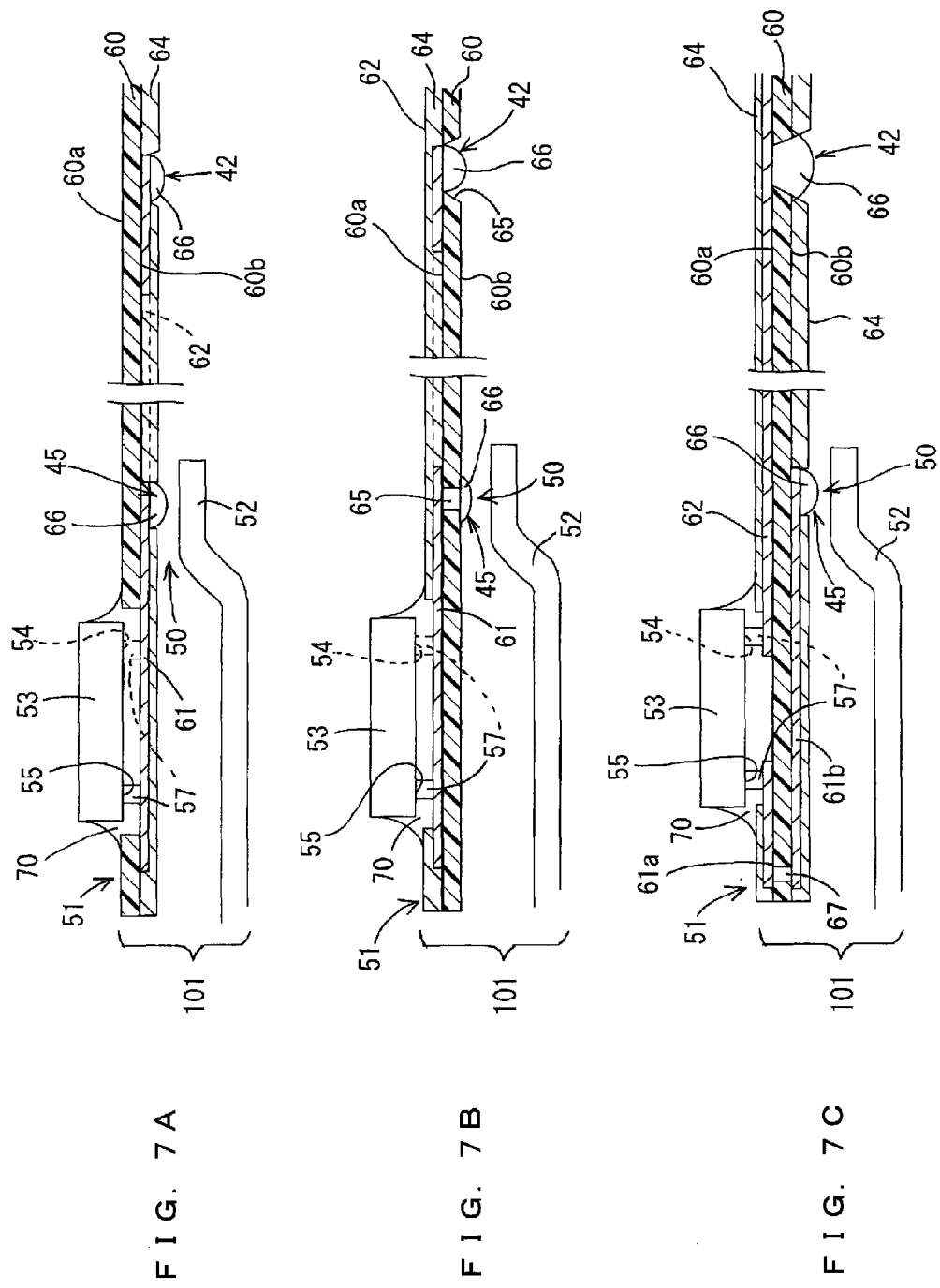

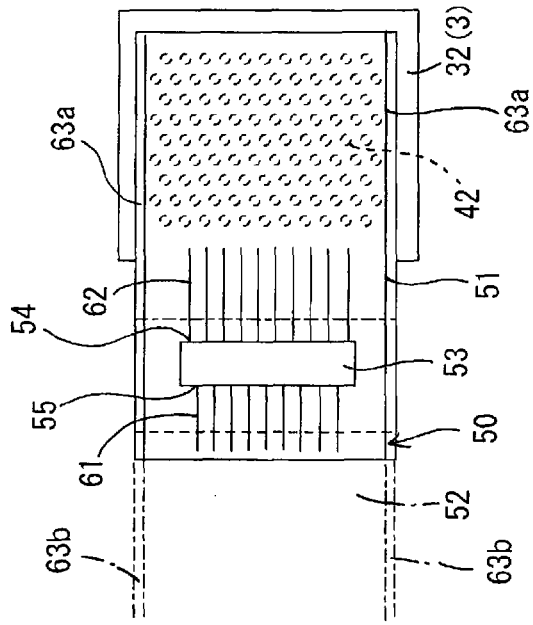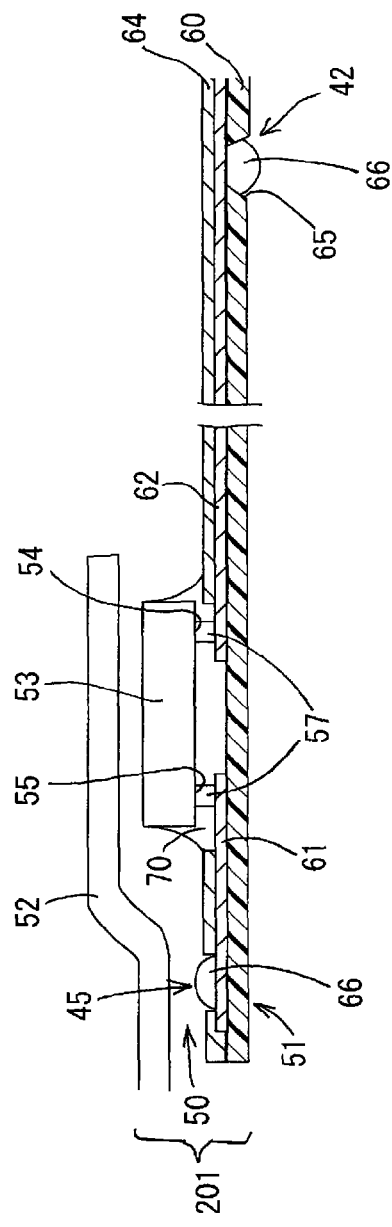
FIG. 8B
FIG. 8A

FLEXIBLE WIRING CABLE

CROSS-REFERENCE TO RELATED APPLICATIONS

This Nonprovisional Application claims priority under 35 U.S.C. §119(a) on Patent Application No. 2007-73228 filed in Japan on Mar. 20, 2007, the entire contents of which are hereby incorporated by reference.

BACKGROUND

The present invention relates to a flexible wiring cable on which a circuit element is mounted.

As the flexible wiring cable mounted with the circuit element, a wiring cable or the like for transmitting a drive signal based on print data to an actuator, as a load, of a recording head discharging ink is known, for example. As disclosed in Japanese Patent Application Laid-Open No. 2005-219337, a recording head includes a cavity part having many nozzles and an ink supply path, and an actuator having an active part corresponding to each nozzle, and the actuator is connected to a flexible wiring cable mounted with a circuit element to be connected to an external signal source.

FIGS. 1A and 1B are a plan view and a side view showing the conventional flexible wiring cable mounted with a circuit element, respectively disclosed in the Japanese Patent Application Laid-Open No. 2005-219337. According to a flexible wiring cable 301, since a first wiring assembly 51 mounts a circuit element 53 and has a complicated wiring to be connected to an actuator 32 (recording head 3), it is high in cost. Therefore, according to the conventional construction shown in FIGS. 1A and 1B, the first wiring assembly 51 is short and a second wiring assembly 52 employing a general-purpose flexible flat cable (FFC) in which leads are wired in parallel is connected to the first wiring assembly 51 at a connection position 50.

SUMMARY

According to the flexible wiring cable 301, the circuit element 53 generates heat when the actuator 32 is driven and as shown in FIG. 1A, the heat of the circuit element 53 is transferred to the actuator 32 through the flexible wiring cable 301. The heat could affect the operation of the actuator 32 and make a difference in ink jet property of ink between a part close to the circuit element 53 and a part apart from the circuit element 53 in the recording head 3. In this respect, according to the construction disclosed in the Japanese Patent Application Laid-Open No. 2005-219337, a radiator (heat sink) is set in contact with the circuit element 53.

When the recording head has many nozzles to implement high-density recording, since the wiring between the circuit element and the actuator is miniaturized and disposed at high density, it is necessary to short the wiring to prevent a voltage from being lowered due to high resistance and to prevent the wiring from being affected by noise. As a result, the circuit element and the actuator are brought closer and even when the radiator (heat sink) is in contact with the circuit element, the problem arises that the heat from the circuit element largely affects the actuator.

An object is to provide a flexible wiring cable in which a circuit element is mounted and the heat of the circuit element to a load can be reduced.

According to a first aspect, a flexible wiring cable includes a first wiring assembly connected to a load, a second wiring assembly connected to the first wiring assembly and extending toward an external signal source, and a circuit element mounted on the first wiring assembly to drive the load. The second wiring assembly is connected to the first wiring assembly at a position between the mounted circuit element and a connection point with the load. Thus, since the second wiring assembly is connected to the first wiring assembly at the position between the mounted circuit element and the connection point with the load, the heat of the heated circuit element is also transferred to the connected second wiring assembly, so that the heat to be transferred to the load can be reduced. As a result, the problem that the operation characteristics of the load are changed by the heat can be alleviated.

According to a second aspect, in the flexible wiring cable set forth in the first aspect, an input lead for the circuit element is wired so as to extend from the circuit element toward the load on the first wiring assembly, and the second wiring assembly is connected to the input lead. Since the input lead for the circuit element is wired so as to extend from the circuit element toward the load, the second wiring assembly can be connected to the first wiring assembly at a position between the mounted circuit element and the connection position with the load.

According to a third aspect, in the flexible wiring cable set forth in the second aspect, the input lead includes a lead part extending on one surface of the first wiring assembly from the circuit element toward the load, and a connection part connected to the lead part and exposed on the other surface of the first wiring assembly, and the second wiring assembly is connected to the connection part. Therefore, even when the second wiring assembly is connected to the other side surface of the first wiring assembly that is the opposite side of the surface on which the lead part is disposed, the lead part and the second wiring assembly can be easily connected at the connection part.

According to a fourth aspect, in the flexible wiring cable set forth in the second or third aspect, a part of the second wiring assembly overlapping the circuit element is adhered to the circuit element in an electrically insulating state. Thus, the heat of the circuit element is likely to be transferred to the second wiring assembly, so that the affect of the heat on the load can be reduced.

According to a fifth aspect, a flexible wiring cable includes a first wiring assembly connected to a load, a second wiring assembly connected to the first wiring assembly and extending toward an external signal source, and a circuit element mounted on the first wiring assembly to drive the load, in which the second wiring assembly is connected to the first wiring assembly at a position closer to the external signal source than the mounted circuit element, and an end portion of the second wiring assembly is elongated so as to overlap the circuit element and a part of the second wiring assembly overlapping the circuit element is adhered to the circuit element in an electrically insulating state. Thus, since the second wiring assembly is connected to the first wiring assembly at the position closer to the external signal source than the mounted circuit element, and the end portion of the second wiring assembly is elongated so as to overlap the circuit element and the part of the second wiring assembly overlapping the circuit element is adhered to the circuit element in an electrically insulating state, the heat of the circuit element is transferred to the second wiring assembly adhered to the circuit element, so that the heat to be transferred from the circuit element to the load can be reduced. As a result, the load can be prevented from malfunctioning due to the heat.

According to a sixth aspect, in the flexible wiring cable set forth in any one of the first to fifth aspects, the load is an actuator of a recording head performing recording operation by selective drive of the actuator. Therefore, by using the flexible wiring cable mounted with the circuit element according to any one of the first to fifth aspects, the heat of the circuit element to be transferred to the actuator can be reduced, so that the ink jet property of the recording head can be prevented from being changed due to the heat.

The above and further objects and features of the invention will more fully be apparent from the following detailed description with accompanying drawings.

BRIEF DESCRIPTION OF THE SEVERAL VIEWS OF THE DRAWINGS

FIG. 5 is a vertical sectional view showing the recording head cut along X direction;

FIG. 6A is a schematic side view showing a flexible wiring cable according to a first embodiment;

FIG. 6B is a top view showing a first wiring assembly;

FIG. 6C is a vertical sectional view showing an essential part of the flexible wiring cable according to the first embodiment;

FIG. 6D is a vertical sectional view showing an essential part of a flexible wiring cable according to a second embodiment;

FIG. 7A is a vertical sectional view showing an essential part of a flexible wiring cable according to a third embodiment;

FIG. 7B is a vertical sectional view showing an essential part of a flexible wiring cable according to a fourth embodiment;

FIG. 7C is a vertical sectional view showing an essential part of a flexible wiring cable according to a fifth embodiment;

FIG. 8A is a vertical sectional view showing an essential part of a flexible wiring cable according to a sixth embodiment; and FIG. 8B is a top view showing a first wiring assembly.

DETAILED DESCRIPTION OF THE EXEMPLARY EMBODIMENTS

An embodiment will be described with reference to the drawings hereinafter.

Figure 1A:
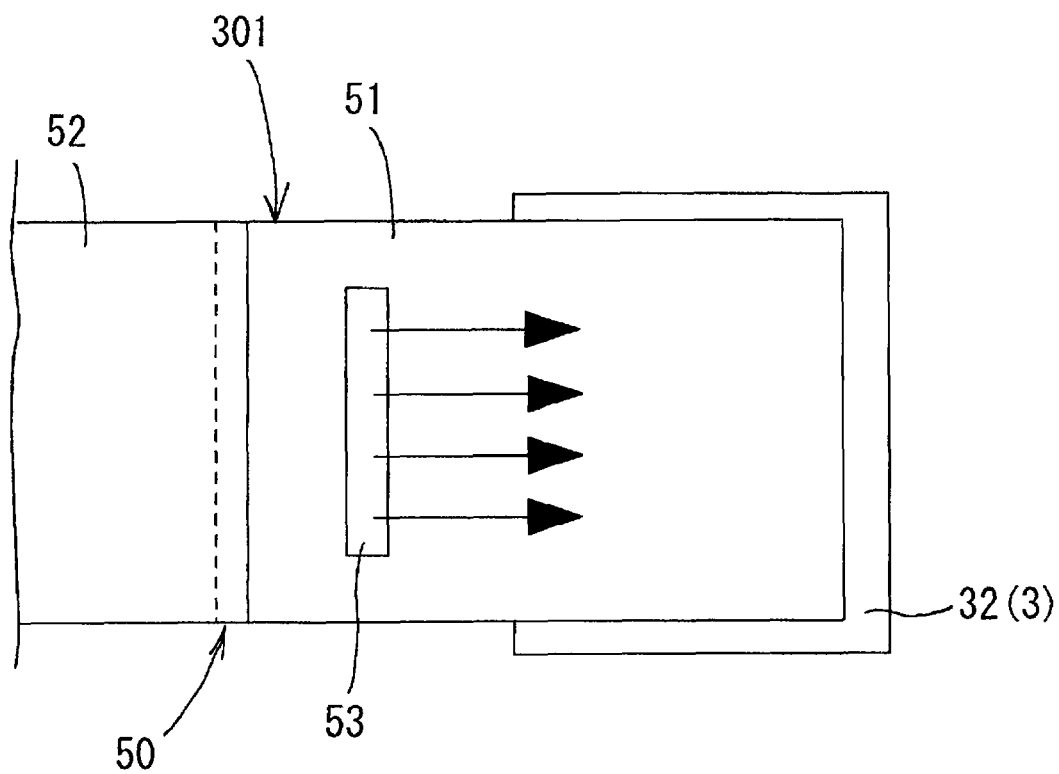
FIG. 1A is a plan view showing a conventional flexible wiring cable mounted with a circuit element.
Figure 1B:
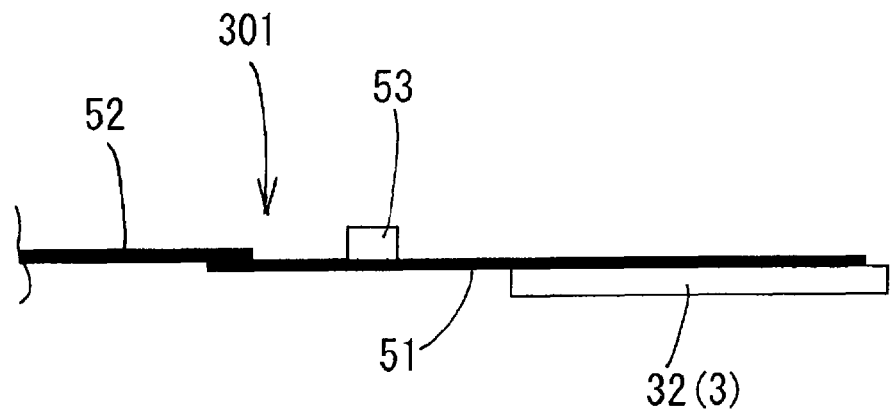
FIG. 1B is a side view showing the conventional flexible wiring cable mounted with the circuit element.
Figure 2:
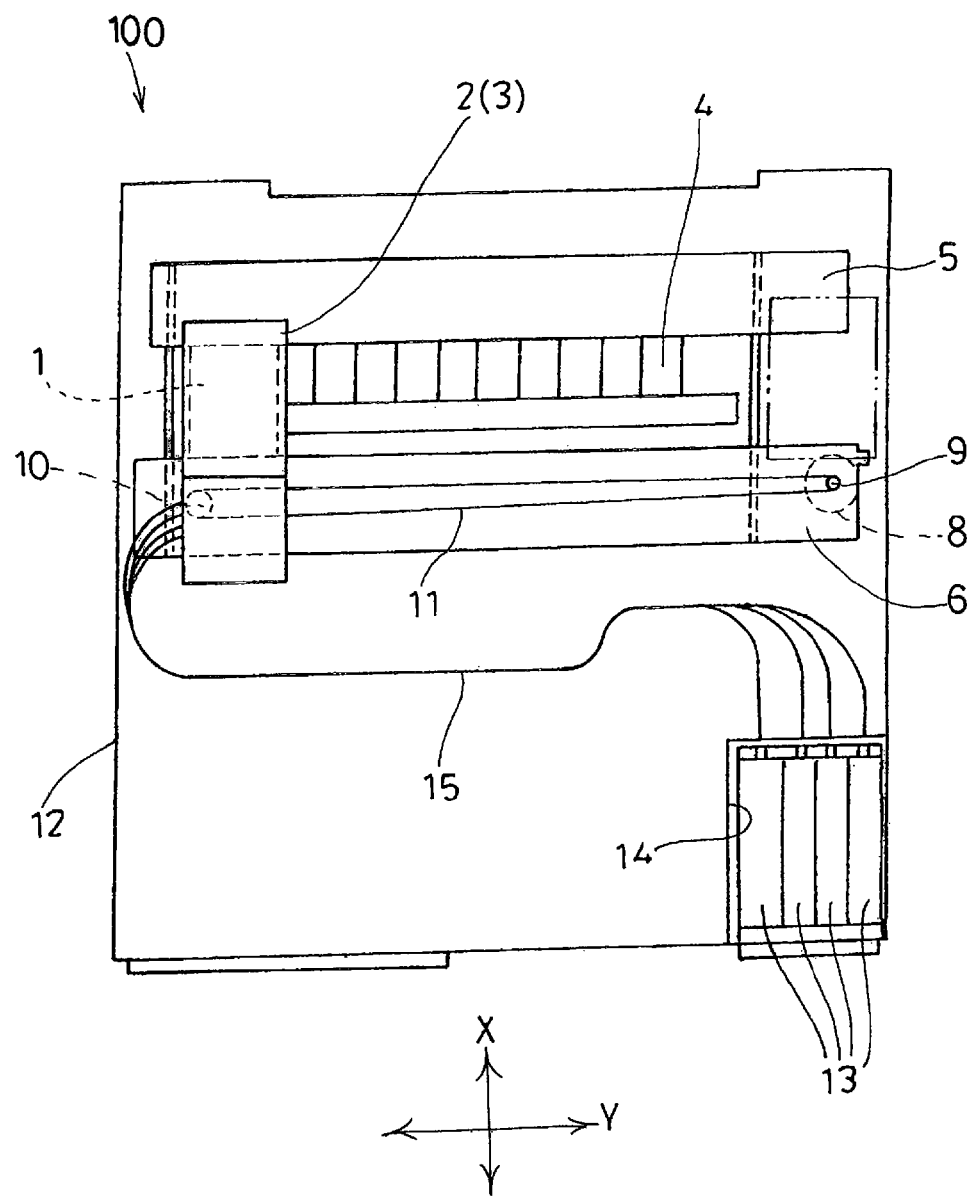
FIG. 2 is a schematic plan view showing a recording device employing a flexible wiring cable.

FIG. 2 is a schematic plan view showing a recording device 100 employing a flexible wiring cable 1 of the embodiment on which a circuit element is mounted. This recording device 100 may be used in a single printer or may be used as a printer function (recording part) in a multifunctional device having a plurality of functions such as a facsimile function and a copy function.

As shown in FIG. 2, the recording device 100 includes a recording head 3 mounted on a carriage 2 and a platen 4 opposed to a lower surface of the recording head 3. A first guide member 5 and a second guide member 6 extend in a main scanning direction (Y-axis direction) of the carriage 2 and the carriage 2 reciprocates along them. The recording head 3 is mounted on the carriage 2 in such a manner that a nozzle 7 (refer to FIG. 5) is exposed so as to be opposed to the platen 4.

A sheet as a recording medium is transferred along a sub scanning direction (X-axis direction) perpendicular to the main scanning direction (Y-axis direction) of the carriage 2. The carriage 2 is moved reciprocally along the Y-axis direction by a timing belt 11 wound around a drive pulley 9 connected to a carriage (CR) motor 8 and a driven pulley 10.

As shown in FIG. 2, a housing part 14 for replaceable ink cartridges 13 is provided in a body frame 12 so that the ink cartridges 13 corresponding to ink colors (here, four cartridges for black ink, cyan ink, magenta ink, and yellow ink) are housed. The ink of each ink cartridge 13 is supplied to the carriage 2 through a flexible ink supply tube (resin tube) 15 independently.

Figure 3:
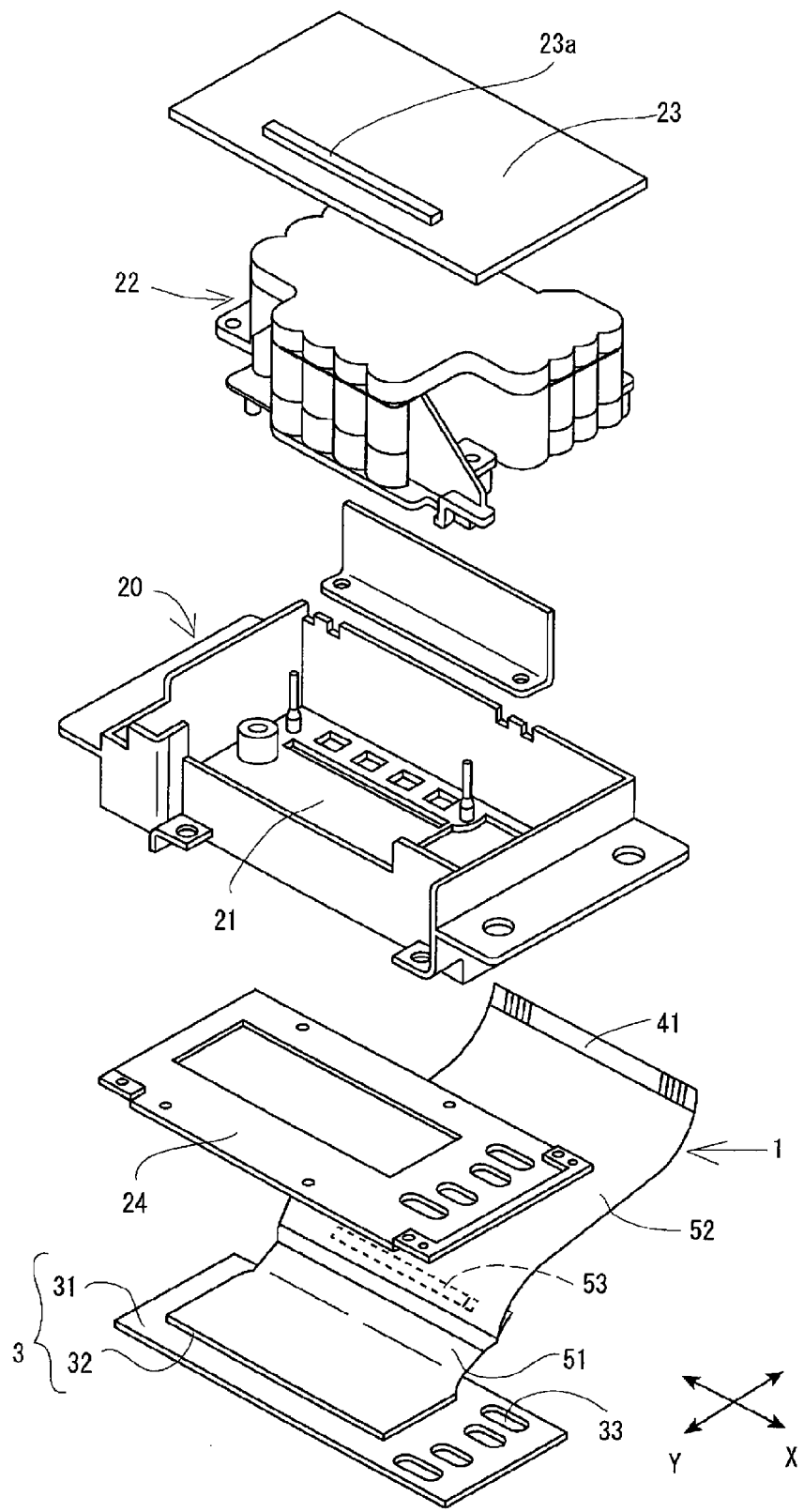
FIG. 3 is an exploded perspective view showing a carriage.

As shown in FIG. 3, the carriage 2 is provided with a roughly box-shaped head holder 20 having an opened upper surface, and the recording head 3 is fixed to a lower surface of a bottom plate 21 of the head holder 20 with a reinforcing frame 24 interposed. An ink storage part 22 in which ink supplied from the ink cartridge 13 is stored once, and a circuit substrate 23 are mounted on an upper surface side of the bottom plate 21 of the head holder 20. The circuit substrate 23 receives a drive signal from a control device (not shown) set in the body frame 12 through a flexible cable (not shown), and supplies the drive signal to an actuator 32 of the recording head 3 through the flexible wiring cable 1 connected to a connector 23a as will be described below.

Figure 4:
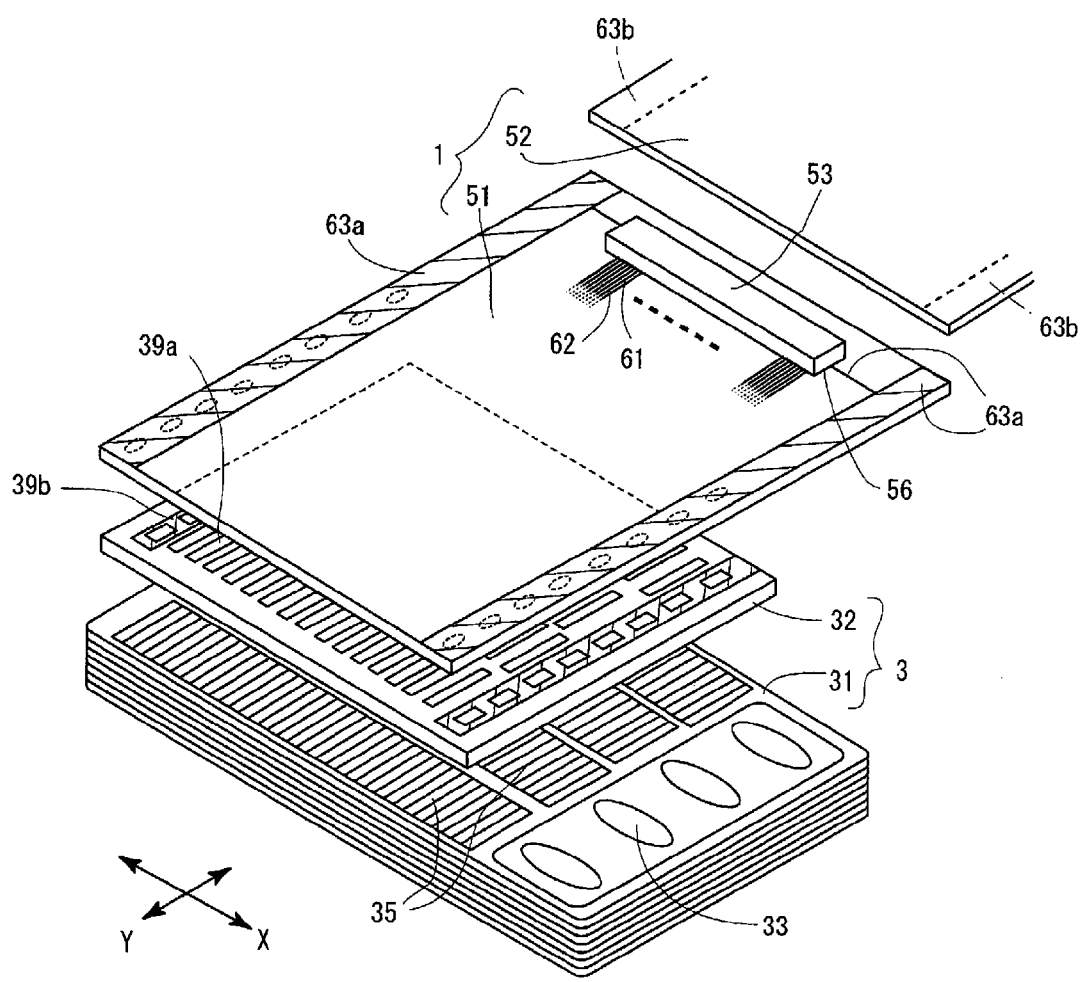
FIG. 4 is a perspective view showing a recording head and the flexible wiring cable.

As shown in FIGS. 3, 4 and 5, according to the recording head 3, similar to Japanese Patent Application Laid-Open No. 2005-322850, a cavity part 31 having an open nozzle 7 on its lower side and a pressure chamber 35 on its upper side, and the plate-shaped actuator 32 are laminated. The cavity part 31 is formed by laminating a plurality of thin plates, and an ink supply path 34 to distribute the ink supplied from the ink storage part 22 to an ink inlet 33 of the cavity part 31 to each of the plurality of pressure chambers 35 is provided in its inside (refer to FIG. 5). The actuator 32 includes a plurality of flat ceramics layers 36 having a size covering all the pressure chambers 35 and laminated in a direction perpendicular to its flat shape direction, and a plurality of electrodes arranged among the plurality of ceramics layers 36.

The electrode includes an individual electrode 37 provided for each pressure chamber 35, and a common electrode 38 provided for the plurality of pressure chambers 35, and they are arranged alternately in the ceramics layers 36. As shown in FIG. 4, the actuator 32 includes an individual surface electrode 39a electrically connecting all the individual electrodes 37 in the laminated direction and introducing it to the surface, and a common surface electrode 39b electrically connecting all the common electrodes 38 in the laminated direction and introducing it to the surface, on its uppermost surface. In addition, the surface electrodes are not shown in FIG. 5.

According to the actuator 32 provided with the electrodes as described above, when a high voltage is applied between the individual electrode 37 and the common electrode 38, a part of the ceramics layer 36 sandwiched between both electrodes is polarized and functions as an active part as known heretofore. In addition, at the time of recording, when a voltage lower than that at the time of polarizing is applied, the active part is elongated and a pressure is applied to the ink in the corresponding pressure chamber 35, so that the ink can be discharged from the nozzle 7.

First Embodiment

A flexible wiring cable 1 electrically connects an output connection electrode 42 (refer to FIG. 6B) formed on a lower surface (back surface) of one end portion of the flexible wiring cable 1 to the surface electrodes 39a and 39b formed on an upper surface (front surface) of the actuator 32. Then, the flexible wiring cable 1 is elongated in a Y-axis direction to connect an input connection electrode 41 at the other end portion to the circuit substrate 23 (refer to FIG. 3).

In addition, a circuit element 53 is mounted on the flexible wiring cable 1. This circuit element 53 converts a drive signal serially transmitted from the circuit substrate 23 to a parallel drive signal corresponding to many individual surface electrodes 39a and outputs the converted signal as a voltage suitable for the drive of an active part. This voltage is applied to the many individual surface electrode 39a, and the common surface electrode 39b is connected to the ground potential (refer to FIG. 4).

As shown in FIGS. 4, 6A and 6B, the flexible wiring cable 1 is constituted by connecting two wiring assemblies in a longitudinal direction (elongated direction), and has a first wiring assembly 51 which has the output connection electrode 42 and on which the circuit element 53 is mounted, and a second wiring assembly 52 having the input connection electrode 41. Thus, the drive signal transmitted from the circuit substrate 23 is inputted to the circuit element 53 through a lead (not shown) of the second wiring assembly 52 and an input lead 61 of the first wiring assembly 51, and a drive signal converted by the circuit element 53 is inputted to the individual surface electrode 39a of the actuator 32 through an output lead 62.

In addition, the ground potential supplied to the common surface electrode 39b of the actuator 32 is supplied through a common lead 63b of the second wiring assembly 52 and a common lead 63a of the first wiring assembly 51.

A chip on flexible film (COF) is suitable for the first wiring assembly 51, and a general-purpose product called a flexible flat cable (FFC) in which leads covered with an insulating material are wired in parallel is suitable for the second wiring assembly 52, or a flexible printed circuit (FPC) may be used for the second wiring assembly 52. In addition, the second wiring assembly 52 may include a plurality of wiring assemblies and the flexible wiring cable 1 may include three or more wiring assemblies as a whole.

According to the first embodiment, as shown in FIG. 6A, the second wiring assembly 52 is electrically connected to the surface of the first wiring assembly 51 on which the circuit element 53 is mounted and which is exposed, at the position (a connection position 50) between the mounted circuit element 53 and the output connection electrode 42 (a connection point with the actuator 32). As shown in FIGS. 4 and 6C, the first wiring assembly 51 is provided such that the input lead 61, the output lead 62 and the common lead 63a are wired on a front surface 60a of a flexible and insulating flat base (formed of a synthetic resin such as polyimide) 60 and these leads are covered with an insulating layer (resist and the like) 64.

The circuit element 53 is mounted on a region in which the insulating layer 64 of the first wiring assembly 51 is partially removed and the input lead 61, the output lead 62 and the common lead 63a are partially exposed on the front surface. The circuit element 53 has a rectangular configuration in plan view and it is disposed on the first wiring assembly 51 such that a side of the circuit element 53 having an output terminal 54 is positioned so as to be closer to the actuator 32 and a side thereof having an input terminal 55 is positioned so as to be further away from the actuator 32. A common terminal 56 is provided on each side thereof perpendicular to the above both sides.

Bumps 57 are formed previously at the output terminal 54, the input terminal 55, and the common terminal 56 of the circuit element 53 toward the leads and those terminals are electrically connected to the corresponding input lead 61, the output lead 62, and the common lead 63a, respectively through the bumps 57 after heat and pressure treatments. After they are connected, the exposed parts of the bums 57 and leads 61 to 63a of the circuit element 53 are covered with a resin 70 to be insulated.

The output lead 62 extends from the output terminal 54 of the circuit element 53 toward the actuator 32 and is connected to the output connection electrode 42. The input lead 61 is elongated from the input terminal 55 to the connection position 50 through the lower surface side of the circuit element 53 (between the circuit element 53 and the base 60) so as to be parallel to the output lead 62.

As shown in FIG. 4, the common lead 63a is wired along both side edges of the first wiring assembly 51 so as to be parallel to the elongated direction and connected to the common surface electrode 39b of the actuator 32 and to each common terminal 56 of the circuit element 53.

As shown in FIG. 6C, the output connection electrode 42 is formed such that the end portion of the output lead 62 at the side of the actuator 32 is exposed to the back surface of the first wiring assembly 51 via a through hole 65 provided in the base 60 and a conductive wax 66 (solder and the like) is attached to this end portion and projected. The part in which the common lead 63a is connected to the common surface electrode 39b has almost the same configuration as that of the output terminal electrode 42.

As shown in FIG. 6C, a terminal electrode 45 is formed on the first wiring assembly 51 at the connection position 50 such that each of the input lead 61 and the common lead 63a is partially exposed by removing the insulating layer 64 and that the conductive wax 66 is attached onto each lead and projected.

Meanwhile, the end portions of the lead (not shown) corresponding to the input lead 61 of the first wiring assembly 51 and the common lead 63b passing along both side edges in the elongated direction of the second wiring assembly 52 are exposed on the second wiring assembly 52 by removing the insulating layer and each end thereof is electrically connected to corresponding each terminal electrode 45 of the first wiring assembly 51.

Thus, since the second wiring assembly 52 is connected to the first wiring assembly 51 at the position between the mounted circuit element 53 and the output connection electrode 42, the heat of the circuit element 53 is also transferred to the second wiring assembly 52 while the heat of the circuit element 53 is transferred to the actuator 32 through the first wiring assembly 51. That is, the heat of the circuit element 53 to be transferred to the actuator 32 can be reduced.

In addition, preferably, when the second wiring assembly 52 overlaps on a surface of the circuit element 53 opposite to the first wiring assembly 51 and is wired to the connector 23a, the heat of the circuit element 53 is further likely to be transferred to the second wiring assembly 52, so that the heat to be transferred to the actuator 32 can be considerably reduced. Since the internal leads of the second wiring assembly 52 are covered with the insulating material, the second wiring assembly 52 is electrically insulated and adhered with and to the circuit element 53. In order to enhance the adhesion, the second wiring assembly 52 may be fixed to the circuit element 53 through an adhesive agent (not shown), or the second wiring assembly 52 may be pressed to the circuit element 53 by an elastic member.

Second Embodiment

FIG. 6D shows a second embodiment in which the same references are allotted to the same components as in the first embodiment and their descriptions will be omitted. Leads 61 to 63a are wired on a back surface 60b of a base 60. In this case, the end portion of the input lead 61 at the side of an actuator 32 is exposed on a front surface 60a of the base 60 via a through hole 65 of the base 60, and a conductive wax 66 is attached to the end portion of the input lead 61 so as to be projected, whereby a terminal electrode 45 (corresponding to a connection part) is formed. A terminal electrode is formed at a common lead 63a similarly.

A circuit element 53 is mounted on the leads 61 to 63a exposed on the front surface by partially removing the base 60, through bumps 57. In addition, an output connection electrode 42 is formed by removing an insulating layer 64 disposed on the back surface 60b and a conductive wax 66 is attached to the end portion of the output lead 62 so as to be projected.

Third to Fifth Embodiments

FIGS. 7A to 7C show third to fifth embodiments in which the same references are allotted to the same components as in the first embodiment and their descriptions will be omitted. A flexible wiring cable 101 according to each of the embodiments is characterized in that a second wiring assembly 52 is connected to a surface of a first wiring assembly 51 opposite to a surface on which a circuit element 53 is mounted, that is, on a back surface 60b of a base 60. Each of the embodiments are the same as the first embodiment in that the heat of the circuit element 53 is transferred to the second wiring assembly 52 while the heat of the circuit element 53 is transferred to an actuator 32 through the first wiring assembly 51.

These embodiments may be also modified according to whether leads 61 to 63a of the first wiring assembly 51 are wired on the front surface or the back surface of the base 60. According to the third embodiment shown in FIG. 7A, leads 61 to 63 are wired on the back surface 60b of the base 60. A terminal electrode 45 and an output connection electrode 42 are formed by attaching a conductive wax 66 so as to be projected, to the input lead 61 and the output lead 62 exposed by removing an insulating layer 64 partially.

Meanwhile, according to the fourth embodiment shown in FIG. 7B, leads 61 to 63a are wired on the front surface 60a of the base 60. A terminal electrode 45 and an output connection electrode 42 are formed by attaching a conductive wax 66 so as to be projected, to the end portions of the input lead 61 and the output lead 62 exposed via a through hole 65 of the base 60.

According to the third and fourth embodiments (FIGS. 7A and 7B), the terminal electrode 45 is formed at the common lead 63a similarly, and the terminal electrodes 45 of the input lead 61 and the common lead 63a are connected to the second wiring assembly 52.

Furthermore, according to the fifth embodiment shown in FIG. 7C, input leads 61a and 61b are wired on the front surface 60a and the back surface 60b of the base 60, respectively. The input lead 61a on the front surface extends from an input terminal 55 of the circuit element 53 toward the end portion opposite to the actuator 32, and the input lead 61b on the back surface extends from the above-described end portion to the position between the circuit element 53 and the actuator 32 (connection position 50). The input lead 61a on the front surface and the input lead 61b on the back surface are connected by a conductive material 67 that penetrates the base 60, at the end portion of the base 60 opposite to the actuator 32.

A terminal electrode 45 (corresponding to the connection part) is formed at the end portion of the input lead 61b on the back surface by removing an insulating layer 64 covering that end portion and attaching a conductive wax 66 thereto. A common lead 63a is also wired over the front surface and the back surface of the base 60 and the terminal electrode 45 is formed at an end portion of the common lead 63a. In addition, the common lead 63a may be wired only on the front surface of the base 60 and the terminal electrode 45 may be formed at the end portion of the common lead 63a through the base 60. The second wiring assembly 52 is connected to the terminal electrodes 45 of the input lead 61b and the common lead 63a.

An output lead 62 is wired on the front surface 60a of the base 60. In this case, since the output lead 62 and the input lead 61a are not aligned on the same surface of the first wiring assembly 51, this is preferable in the case where a wiring pitch of the output lead 62 is fine.

Sixth Embodiment

FIGS. 8A and 8B show a sixth embodiment in which the same references are allotted to the same components as in the first embodiment and their descriptions will be omitted. According to a flexible wiring cable 201 in the sixth embodiment, a second wiring assembly 52 is connected to a first wiring assembly 51 on an exposed surface on which a circuit element 53 is mounted and at an end portion further away from an actuator 32 than the mounted circuit element 53.

According to the first wiring assembly 51, leads 61 to 63a are wired on a front surface 60a of a base 60, and the input lead 61 extends from an input terminal 55 of the circuit element 53 to the above-described end portion. A terminal electrode 45 is formed at the end portion of the input lead 61 by removing an insulating layer 64 and attaching a conductive wax 66 thereto. The common lead 63a also extends toward the end portion of the base 60 and the terminal electrode 45 is formed at the end portion of the common lead 63a similarly. In addition, the leads 61 to 63a may be formed on a back surface 60b of the base 60. In this case, the terminal electrode 45 is exposed on the front surface through the base 60.

As shown in FIG. 8A, the end portion of the second wiring assembly 52 at the side closer to the actuator 32 is elongated to the position so as to overlap the circuit element 53 in plan view and this overlapping part is adhered to the circuit element 53 in an electrically insulating state. The second wiring assembly 52 is electrically connected to the terminal electrode 45 of the first wiring assembly 51 at the part closer to a connector 23a than the end portion of the second wiring assembly 52 after an insulating layer at that part has been removed.

Thus, the heat of the circuit element 53 can be transferred to the direction away from the actuator 32 through the second wiring assembly 52 adhered to the circuit element 53. As a result, effect of the heat on the actuator 32 can be reduced.

When a well-known radiator (heat sink) formed of a heat conductive material is directly or indirectly in contact with the circuit element 53 in each embodiment, the effect of the heat on the actuator 32 can be reduced more.

In addition, the flexible wiring cable mounted with the circuit element according to the present invention can be applied not only to the one including the recording head 3 of the recording device 100 as an electric load described in the above embodiment, but also to another device including a crystal liquid display as a load.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A flexible wiring cable comprising:
   a first wiring assembly connected to a load;
   a second wiring assembly connected to the first wiring assembly and extending toward an external signal source; and
   a circuit element mounted on the first wiring assembly to drive the load; wherein
   the second wiring assembly is connected to the first wiring assembly at a position between the mounted circuit element and a connection point with the load.

2. The flexible wiring cable according to claim 1, wherein an input lead for the circuit element is wired so as to extend from the circuit element toward the load on the first wiring assembly, and the second wiring assembly is connected to the input lead.

3. The flexible wiring cable according to claim 2, wherein the input lead comprises a lead part extending on one surface of the first wiring assembly from the circuit element toward the load, and a connection part connected to the lead part and exposed on the other surface of the first wiring assembly, and the second wiring assembly is connected to the connection part.

4. The flexible wiring cable according to claim 2, wherein a part of the second wiring assembly overlapping the circuit element is adhered to the circuit element in an electrically insulating state.

5. The flexible wiring cable according to claim 1, wherein the load is an actuator of a recording head performing recording operation by selective drive of the actuator.

6. A flexible wiring cable comprising:
   a first wiring assembly connected to a load;
   a second wiring assembly connected to the first wiring assembly and extending toward an external signal source; and
   a circuit element mounted on the first wiring assembly to drive the load; wherein
   the second wiring assembly is connected to the first wiring assembly at a position closer to the external signal source than the mounted circuit element, and
   an end portion of the second wiring assembly is elongated so as to overlap the circuit element and a part of the second wiring assembly overlapping the circuit element is adhered to the circuit element in an electrically insulating state.

7. The flexible wiring cable according to claim 6, wherein the load is an actuator of a recording head performing recording operation by selective drive of the actuator.

* * * * *